US005828206A

United States Patent [19]

Hosono et al.

[11] Patent Number: 5,828,206

[45] Date of Patent: Oct. 27, 1998

[54] SERIAL CONTROL TYPE VOLTAGE REGULATOR

[75] Inventors: Rinya Hosono; Takeyuki Kouti, both of Tsurugashima, Japan

[73] Assignee: Toko Kabushiki Kaisha, Tokyo-to, Japan

[21] Appl. No.: 616,735

[22] Filed: Mar. 15, 1996

[30] Foreign Application Priority Data

Mar. 17, 1995 [JP] Japan .................................. 7-086119

[51] Int. Cl.[6] .................................................. G05F 1/56

[52] U.S. Cl. ......................................... 323/273; 323/282

[58] Field of Search .................................. 323/270, 271, 323/273, 275, 282, 285

[56] References Cited

U.S. PATENT DOCUMENTS 5,309,082 5/1994 Payne ...................................... 323/273
5,563,500 10/1996 Muterspaugh .......................... 323/282
5,563,501 10/1996 Chan ....................................... 323/282

FOREIGN PATENT DOCUMENTS 0 238 803 9/1987 European Pat. Off. .
6-10413 3/1994 Japan .

*Primary Examiner*—Matthew V. Nguyen
*Attorney, Agent, or Firm*—Cushman Darby & Cushman IP Group of Pillsbury Madison & Sutro, LLP

[57] ABSTRACT

The disclosed serial control type voltage regulator can prevent current from flowing from a backup capacitor (C1) to the side of the voltage regulator, when the control transistor (Q1) stops operating, reducing the power consumption of the backup voltage supply. In the serial control type voltage regulator having a control transistor (Q1) connected in series between an input terminal (1) and where an output terminal (2), an output voltage detector (6) and an error amplifier (4) are used for comparing an output voltage detected by the output voltage detector with a reference voltage (E3) to control the control transistor, there are provided a first switching element (Q3) for cutting off the output voltage detector (4) when the control transistor (Q1) stops operating and a second switching element (Q4) for cutting off the error amplifier (4) also when the control transistor (Q1) stops operating. When the error amplifier is constructed by field effect transistors, the second switching element can be eliminated since the input impedance of the field effect transistor is high.

4 Claims, 3 Drawing Sheets

SERIAL CONTROL TYPE VOLTAGE REGULATOR

BACKGROUND OF THE INVENTION

1. Field of the Invention

The present invention relates to a serial control type voltage regulator, and more specifically to a serial control type voltage regulator which can prevent current flowing from an output capacitor or a backup voltage supply connected to an output terminal of the output capacitor into the inside of the voltage regulator itself when an output voltage cannot be obtained from the output terminal due to a stoppage of or mal-operation of a control transistor of the voltage regulator.

2. Description of the Prior Art

FIG. 6 is a circuit diagram showing an example of a prior art serial control type voltage regulator. In the drawing, a control transistor Q1 is connected in series between an input terminal 1 and an output terminal 2. An output voltage detector 5 composed of two series-connected resistors R1 and R2 is connected between the output terminal 2 and the ground, to detect an output voltage thereof.

A voltage corresponding to the output voltage detected by the output voltage detector 5 is compared with a reference voltage of a voltage supply E3 by an error amplifier 3, and an output voltage of the error amplifier 3 is applied to a base of a transistor Q2. Therefore, the base current of a control transistor Q1 can be controlled by the output voltage of the error amplifier 3 via the transistor Q2, so that the impedance of the control transistor Q1 is controlled in such a way that a predetermined voltage can be obtained at the output terminal 2. In FIG. 6, E1 is a voltage supply for supplying an input voltage to the input terminal 1, and C1 is an output capacitor. In order to improve the control conditions of the control transistor Q1 when the output current is small, a series circuit composed of a resistor R4 and a Schottky diode D1 is connected between the emitter and base of the control transistor Q1. The above-mentioned prior art serial control type voltage regulator is disclosed by the same Inventor in Japanese Utility Model Publication No. 6-10413.

Recently, the above-described serial control type voltage regulator has been widely used as a voltage supply for a portable personal computer, such that a backup voltage supply E2 is often connected to the output terminal 2 thereof.

In the above-mentioned regulator, when the control transistor Q1 is operating normally, the voltage regulator can supply a voltage to a load connected to the output terminal 2 thereof, and simultaneously a voltage to the voltage supply E2 via a resistor R3 to charge up it.

On the other hand, when the control transistor Q1 stops operating (turned off) or is operating abnormally, a voltage is supplied to the load from the backup voltage supply E2. Further, there exists such a case where no voltage supply E2 is connected by assuming only a short time stoppage of the control transistor Q1. In this case, a voltage charged up in the output capacitor C1 of the voltage regulator is used as the backup voltage supply.

Further, when the voltage supply E1 is removed for replacement or disconnected from the input terminal 1 through a switch (not shown) or when the voltage of the voltage supply E1 drops lower than a predetermined voltage, the operation of the control transistor Q1 stops. When the operation of the control transistor Q1 stops, no voltage is developed at the output terminal 2.

In the above-mentioned voltage regulator, when the voltage supply E2 and the output capacitor C1 are used as a backup voltage supply, since the output voltage detector 5 of the voltage regulator is connected to the backup voltage supply E1 or the capacitor C1, current flows inevitably from the voltage supply E2 and the capacitor C1 to the side of the output voltage detector 5 in addition to the load. Consequently, the backup voltage supply is consumed quickly. In addition, under the normal conditions such that the control transistor Q1 is operative and thereby the error amplifier 3 is also in operation, the input impedance of the error amplifier 3 is relatively high, because the error amplifier 3 is generally of a differential amplifier. However, once the control transistor Q1 stops operating or be inoperative, the impedance of the error amplifier 3 is not necessarily high. Therefore, once control transistor Q1 stops operating, current flows also through the error amplifier 3, causing the backup voltage supply to be consumed quickly.

SUMMARY OF THE INVENTION

With these problems in mind, therefore, it is the object of the present invention to provide a serial control type voltage regulator, which can prevent current flowing from the backup voltage supply (including the output capacitor) connected to the output terminal thereof into the voltage regulator, thereby preventing power consumption of the backup voltage supply.

To achieve the above-mentioned object, the present invention provides a serial control type voltage regulator which comprises: a first switching element connected to the output voltage detector for cutting off the output voltage detector whenever the control transistor stops operating, and an error amplifier for preventing current flowing from the output voltage detector connected to the inside thereof to the voltage regulator itself whenever the control transistor stops operating.

In the serial control type voltage regulator according to the present invention, when the control transistor stops operating, since the output voltage detector is cut off by the first switching element, and in addition since current flowing from the output voltage detector to the error amplifier is prevented, it is possible to reduce the power consumption of the backup voltage supply due to the current flowing back into the voltage regulator itself.

DETAILED DESCRIPTION OF THE PREFERRED EMBODIMENTS

An embodiment of the serial control type voltage regulator according to the present invention will be described hereinbelow with reference to the attached drawings.

Figure 1:
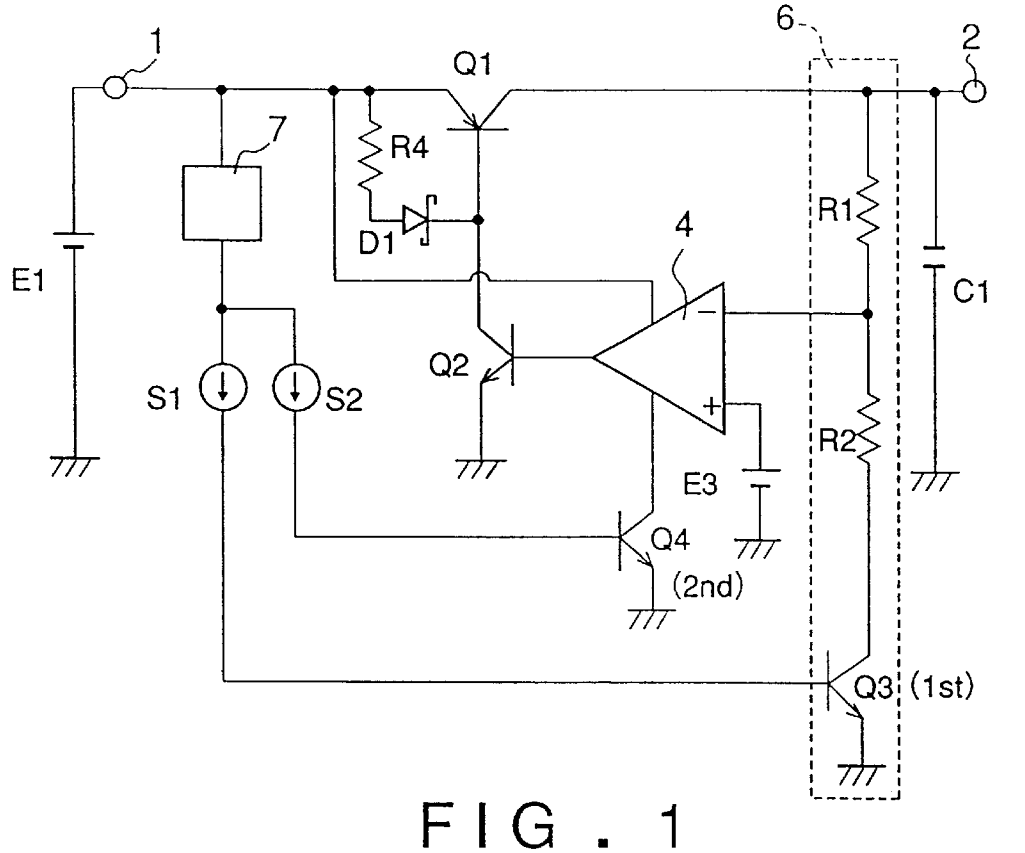
FIG. 1 is a circuit diagram showing an embodiment of the serial control type voltage regulator according to the present invention.
Figure 6:
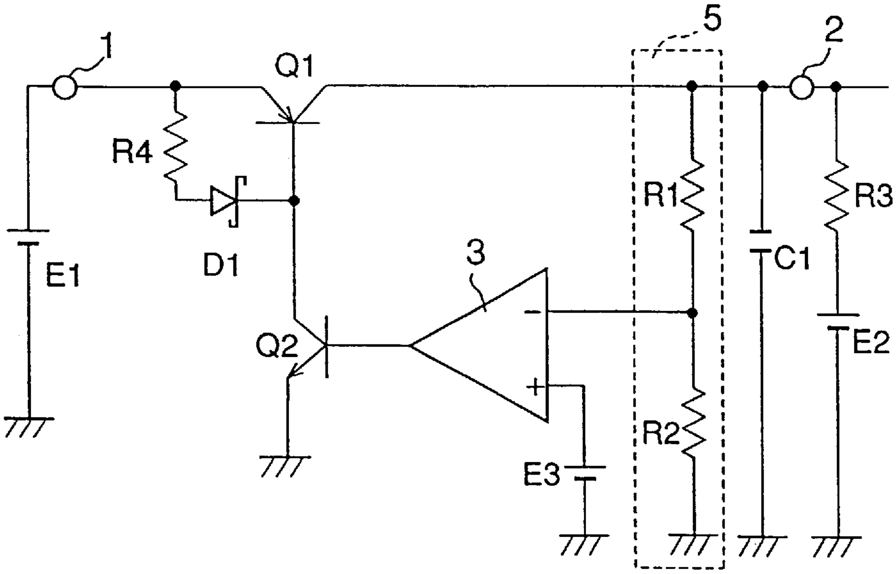
FIG. 6 PRIOR ART
FIG. 6 is a circuit diagram showing an example of prior art serial control type voltage regulators.

FIG. 1 is a circuit diagram of the voltage regulator, in which the same reference numerals have been retained for the similar circuit elements having the same functions as with the case of the prior art voltage regulator shown in FIG. 6.

In FIG. 1, a PNP control transistor Q1 is connected in series between an input terminal 1 and an output terminal 2, and an output voltage detector 6 is connected between the output terminal 2 and the ground.

The output voltage detector 6 is composed of two series-connected voltage dividing resistors R1 and R2 and an NPN transistor Q3 which is referred to as a first switching element.

An error amplifier 4 is of differential amplifier, which has an inversion input terminal (−) connected to a connection point of the two resistors R1 and R2 and a non-inversion input terminal (+) connected to a voltage supply E3 for supplying a reference voltage. Further, an NPN transistor Q4 is connected as a bias input for the error amplifier 4, so that a bias current flows from the input terminal 1 to the ground through the NPN transistor Q4 which is referred to as a second switching element.

The output side of the error amplifier 4 is connected to the base of the NPN transistor Q2. The collector of the transistor Q2 is connected to the base of the control transistor Q1, and the emitter of the transistor Q2 is grounded.

A constant current source S1 is connected between the input terminal 1 via an input voltage detector 7 and the base of the transistor Q3. Similarly, a constant current source S2 is connected between the input terminal 1 via the input voltage detector 7 and the base of the transistor Q4.

This input voltage detector 7 stops supplying current to the two constant current sources S1 and S2, when a voltage of the voltage supply E1 connected to the input terminal 1 drops below a predetermined value, a condition causing the control transistor Q1 to stop operating. Here, the two constant current sources S1 and S2 may be of current mirror circuit.

Figure 3:
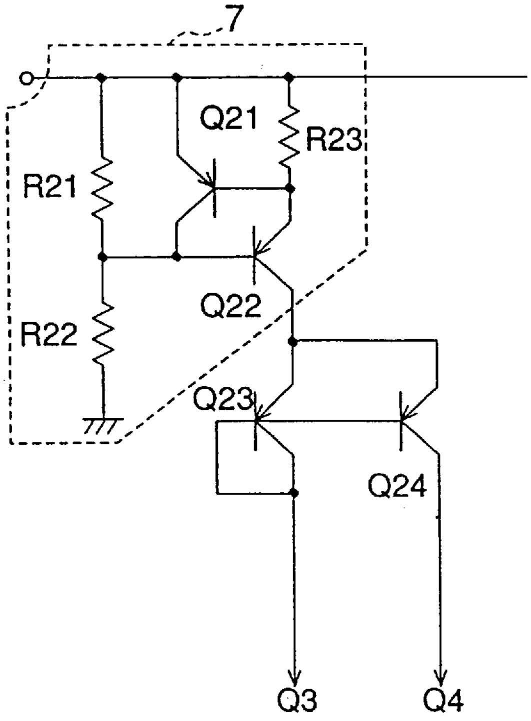
FIG. 3 is a more detailed circuit diagram showing an input voltage detector and two constant current sources.

FIG. 3 is a practical circuit including the input voltage detector 7 and the two constant current sources S1 and S2. In FIG. 3, two transistors Q21 and Q22 and three resistors R21, R22 and R23 constitute the input voltage detector 7; and two transistors Q23 and Q24 for constituting a current mirror circuit operate as the two constant current sources S1 and S2, respectively. Here, the current of the current mirror circuit can be determined on the basis of the base-emitter voltage of the transistor Q21, and the resistor R23.

Figure 2:
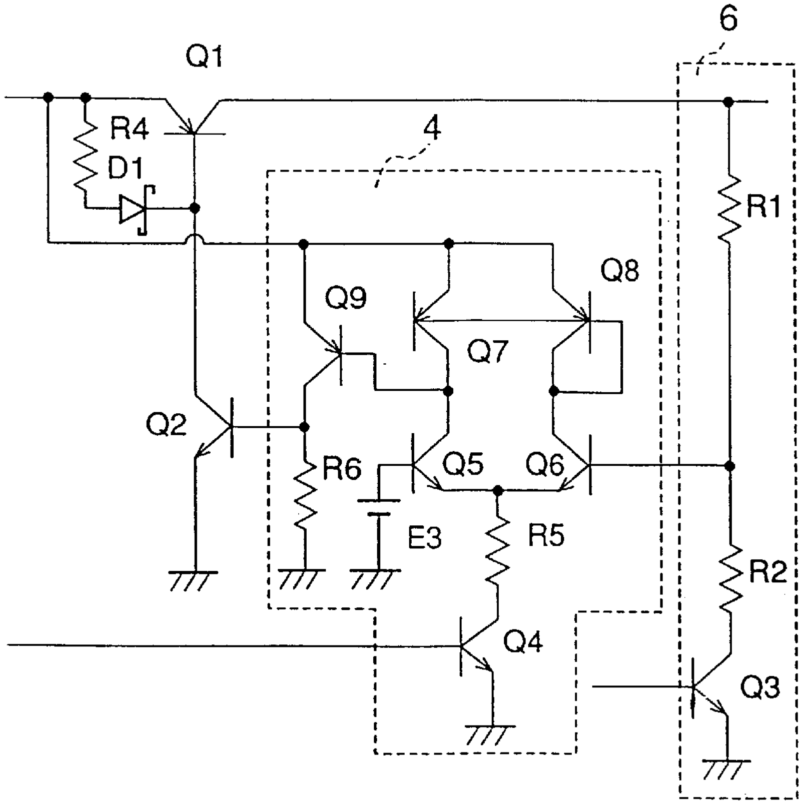
FIG. 2 is a more detailed circuit diagram showing an error amplifier shown in FIG. 1.

FIG. 2 is a more detailed circuit diagram showing the error amplifier 4. The error amplifier 4 enclosed by dashed lines in FIG. 2 is constructed by a differential pair composed of two NPN transistors Q5 and Q6, an active load composed of two PNP transistors Q7 and Q8, a resistor R5 serving as a constant current source, and the transistor Q4 (the second switching element). In addition, a level shift circuit composed of an NPN transistor Q9 and a resistor R6 is connected.

In FIG. 1, the entire error amplifier 4 is represented by a single block for brevity, and only the transistor Q4 and the voltage supply E3 directly related to the present invention are shown outside the block.

The output voltage of the serial control type voltage regulator shown in FIG. 1 can be controlled in the same way as with the case of the prior art voltage regulator shown in FIG. 6. However, the voltage regulator shown in FIG. 1 is different from the prior art voltage regulator shown in FIG. 6 in the following points: when the control transistor Q1 stops operating e.g., if the input voltage drops below a predetermined voltage or the voltage supply E1 is removed from the input terminal 1;, the output voltage detector 6 is cut off by the first switching element (Q3), and the passage of the bias current of the error amplifier 4 is also cut off by the second switching element (Q4). This is because the input voltage detector 7 is turned off or becomes inoperative when a lower or zero input voltage is detected, so that the base current of the transistor Q3 of the output voltage detector 6 cannot be supplied from the constant current source S1 (i.e., the transistor Q23 shown in FIG. 3), and so that the base current of the transistor Q4 of the error amplifier 4 cannot be supplied from the constant current source S2 (i.e., the transistor Q24 shown in FIG. 3).

As a result, even when the output capacitor C1 is used as a backup voltage supply, since the transistor Q3 is turned off, current will not flow from the capacitor C1 to the ground through the two resistors R1 and R2 and the transistor Q3.

In the same way, since the transistor Q4 is turned off, the bias current of the error amplifier 4 (i.e., the four transistors Q5, Q6, Q7 and Q8 shown in FIG. 2) is cut off. In addition, as shown in FIG. 2, current will not flow from the output voltage detector 6 to the error amplifier 4 due to the presence of the transistors of opposite polarity. For instance, current will not flow from the output voltage detector 6 to the emitter of the transistor Q6 because the transistor Q5 is determined to the opposite polarity to the current. Further, current will not flow from the output voltage detector 6 to the collector of the transistor Q6 because the transistors Q7 and Q8 are both determined to the opposite polarity of the current. As a result, no current flow from the output voltage detector 6 to the side of the error amplifier 4. Therefore, it is possible to prevent current from flowing from the backup voltage supply to the serial control voltage regulator, with the result that the power consumption of the backup voltage supply can be prevented.

Further, in the above-mentioned embodiment, the transistor Q4 is used as the second switching element. However, a current mirror circuit can be used instead of transistor Q4 if setup such that current flow is stopped through the current mirror circuit when the control transistor Q1 stops operating, it is possible to use the constant current source circuit and the second switching element in common. Further, in this case, the resistor R5 can be eliminated.

Figure 4:
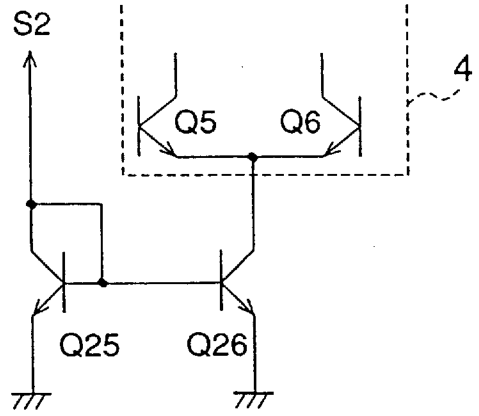
FIG. 4 is a partial circuit diagram showing a modification of the serial control type voltage regulator, in which a second switching transistor Q4 and the constant current source shown in FIG. 1 are combined with each other.

FIG. 4 is a partial circuit diagram showing this modification. In FIG. 4, the current mirror circuit composed of two transistors Q25 and Q26 is connected to a differential pair composed of two transistors Q5 and Q6. Further, the collector of the transistor Q25 is connected to the constant current source S2.

Further, although a bipolar transistor is used as the first switching element (Q3) for cutting off the output voltage detector 6, it is of course possible to use a field effect type transistor such as a MOS transistor.

Still further, the entire error amplifier 4 can be constructed by use of the field effect transistors. In this case, since the input impedance of the field effect transistor is very high, even if there exists no switching element for cutting off the bias current passage of the error amplifier 4, it is possible to prevent current from flowing from the backup voltage supply to the error amplifier 4.

Figure 5:
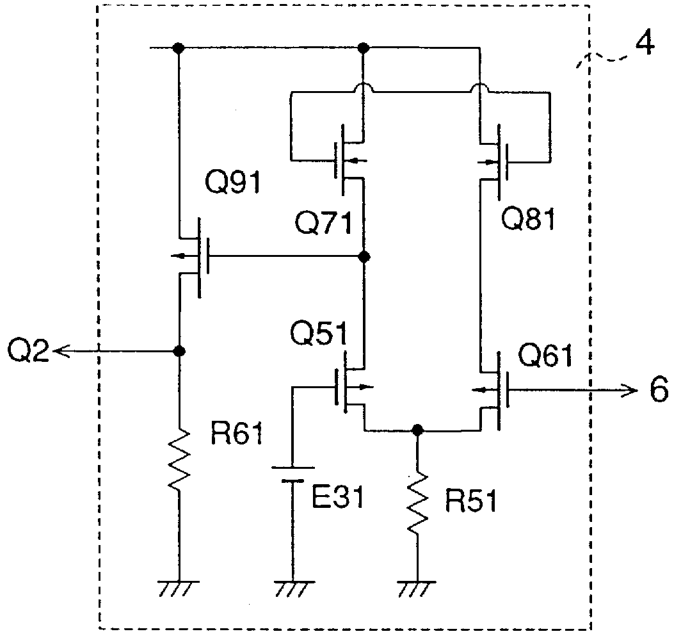
FIG. 5 is a circuit diagram showing the error amplifier shown in FIG. 1, which is constructed by field effect transistors.

FIG. 5 is a circuit diagram showing the error amplifier 4 constructed by the field effect transistors. In FIG. 5, five field effect transistors Q51, Q61, Q71, Q81 and Q91, two resistors R51 and R61, and a voltage supply E31 constitute an error amplifier 4 of differential amplifier type. The reference numerals (in each tens digit) of the transistors, resistors and the voltage supply shown in FIG. 5 are represented in correspondence to the reference numerals shown in FIG. 2. For instance, the transistors Q71 and Q81 shown in FIG. 5 correspond to the transistor Q7 and Q8 shown in FIG. 2, respectively.

Further, in FIG. 1, the first switching transistor (Q3) can be connected at various places around the output voltage detector 6, as far as it is connected in series with the voltage dividing resistors (R1 and R2). A Darlington-connected transistor can be used to replace the control transistor Q1.

As described above, in the serial control type voltage regulator according to the present invention, whenever the control transistor Q1 is not operating normally, the first switching element (Q3) is provided to cut off the output voltage detector (6) and the second switching element (Q4) is provided to cut off the error amplifier (4). It is therefore possible to prevent the current flowing from the backup voltage supply to the voltage regulator side, effectively reducing the power consumption of the backup voltage supply so as to prolong its life.

Furthermore, when the field effect transistors are used for the error amplifier 4, it is possible to eliminate the second switching element Q4.

What is claimed is:

1. A serial control type voltage regulator comprising:

an input terminal;

an output terminal;

a control transistor connected in series between the input terminal and the output terminal;

an input voltage detector coupled with the input terminal for detecting an input voltage at the input terminal;

an output voltage detector coupled with the output terminal for detecting an output voltage at the output terminal;

an error amplifier for controlling the control transistor based on a comparison between the output voltage detected by the output voltage detector with a reference voltage, the error amplifier including a differential amplifier and a second switching element, the first switching element cutting off a bias current to the differential amplifier when the control transistor stops operation; and a second switching element for cutting off the output voltage detector when the control transistor stops operation, whereby the first and second switching elements are operated to cut off based on the input voltage detected by the input voltage detector.

2. A serial control type voltage regulator comprising:

an input terminal;

an output terminal;

a control transistor connected in series between the input terminal and the output terminal;

an input voltage detector coupled with the input terminal for detecting an input voltage at the input terminal;

an output voltage detector coupled with the output terminal for detecting an output voltage at the output terminal;

an error amplifier for controlling the control transistor based on a comparison between the output voltage detected by the output voltage detector with a reference voltage, the error amplifier including a differential amplifier having a differential pair of transistors with a first polarity, an active load comprising transistors with a second polarity opposite the first polarity, and a first switching element for cutting off a bias current to the differential amplifier when the control transistor stops operating; and a second switching element for cutting off the output voltage detector when the control transistor stops operation, whereby the first and second switching elements are operated to cut off based on the input voltage detected by the input voltage detector.

3. The serial control type voltage regulator of claim 1, wherein the output voltage detector comprises a series combination of the second switching element with output voltage dividing resistors.

4. The serial control type voltage regulator of claim 2, wherein the output voltage detector comprises a series combination of the second switching element with output voltage dividing resistors.

* * * * *